United States Patent
Shaeffer et al.

(10) Patent No.: US 11,955,161 B2
(45) Date of Patent: Apr. 9, 2024

(54) COMMAND-TRIGGERED DATA CLOCK DISTRIBUTION MODE

(71) Applicant: Rambus Inc., San Jose, CA (US)

(72) Inventors: Ian Shaeffer, Los Gatos, CA (US); Lei Luo, Chapel Hill, CA (US); Liji Gopalakrishnan, Sunnyvale, CA (US)

(73) Assignee: Rambus Inc., San Jose, CA (US)

( * ) Notice: Subject to any disclaimer, the term of this patent is extended or adjusted under 35 U.S.C. 154(b) by 0 days.

(21) Appl. No.: 18/103,386

(22) Filed: Jan. 30, 2023

(65) Prior Publication Data

US 2023/0326513 A1 Oct. 12, 2023

Related U.S. Application Data

(63) Continuation of application No. 17/341,048, filed on Jun. 7, 2021, now Pat. No. 11,587,605, which is a
(Continued)

(51) Int. Cl.
| | | |
|---|---|---|
| *G06F 1/04* | (2006.01) | |
| *G06F 1/08* | (2006.01) | |
| *G06F 1/3234* | (2019.01) | |
| *G06F 1/3237* | (2019.01) | |
| *G11C 7/10* | (2006.01) | |

(Continued)

(52) U.S. Cl.
CPC ............ *G11C 11/4076* (2013.01); *G06F 1/04* (2013.01); *G06F 1/08* (2013.01); *G06F 1/3234* (2013.01); *G06F 1/3237* (2013.01); *G11C 7/1072* (2013.01); *G11C 7/20* (2013.01); *G11C 7/22* (2013.01); *G11C 11/4072* (2013.01); *G11C 11/4074* (2013.01); *G11C 11/4087* (2013.01); *G11C 11/4096* (2013.01); *Y02D 10/00* (2018.01); *Y02D 30/50* (2020.08)

(58) Field of Classification Search
CPC ..... G11C 11/4076; G11C 7/1072; G11C 7/20; G11C 7/22; G11C 11/4072; G11C 11/4074; G11C 11/4087; G11C 11/4096; G06F 1/04; G06F 1/08; G06F 1/3234; G06F 1/3237; Y02D 10/00; Y02D 30/50
USPC ........................................................ 365/149
See application file for complete search history.

(56) References Cited

U.S. PATENT DOCUMENTS

| | | | |
|---|---|---|---|
| 6,751,696 B2 * | 6/2004 | Farmwald .............. | G11C 7/225 |
| | | | 711/E12.089 |
| 8,131,882 B2 | 3/2012 | Melvin | |

(Continued)

OTHER PUBLICATIONS

PCT International Preliminary Report on Patentability dated Sep. 19, 2013 (Chapter I) in International Application No. PCT/US2012/028289. 7 pages.

(Continued)

*Primary Examiner* — Ly D Pham
(74) *Attorney, Agent, or Firm* — Charles Shemwell

(57) ABSTRACT

An integrated circuit includes a physical layer interface having a control timing domain and a data timing domain, and circuits that enable the control timing domain during a change in power conservation mode in response to a first event, and that enable the data timing domain in response to a second event. The control timing domain can include interface circuits coupled to a command and address path, and the data timing domain can include interface circuits coupled to a data path.

21 Claims, 11 Drawing Sheets

Related U.S. Application Data continuation of application No. 16/865,928, filed on May 4, 2020, now Pat. No. 11,049,546, which is a continuation of application No. 16/032,633, filed on Jul. 11, 2018, now Pat. No. 10,665,289, which is a continuation of application No. 15/616,209, filed on Jun. 7, 2017, now Pat. No. 10,026,466, which is a continuation of application No. 15/242,423, filed on Aug. 19, 2016, now Pat. No. 9,704,560, which is a continuation of application No. 14/799,362, filed on Jul. 14, 2015, now Pat. No. 9,430,027, which is a continuation of application No. 13/980,368, filed as application No. PCT/US2012/028289 on Mar. 8, 2012, now Pat. No. 9,098,281.

(60) Provisional application No. 61/451,023, filed on Mar. 9, 2011.

(51) Int. Cl.
| | | |
|---|---|---|
| *G11C 7/20* | (2006.01) | |
| *G11C 7/22* | (2006.01) | |
| *G11C 11/4072* | (2006.01) | |
| *G11C 11/4074* | (2006.01) | |
| *G11C 11/4076* | (2006.01) | |
| *G11C 11/408* | (2006.01) | |
| *G11C 11/4096* | (2006.01) | |

(56) References Cited

U.S. PATENT DOCUMENTS

| | | | |
|---|---|---|---|
| 8,199,589 | B2 | 6/2012 | Moon |
| 9,098,281 | B2 | 8/2015 | Shaeffer et al. |
| 11,049,546 | B2 | 6/2021 | Shaeffer et al. |
| 2003/0189868 | A1 | 10/2003 | Riesenman et al. |
| 2008/0002516 | A1 | 1/2008 | Tsern et al. |
| 2008/0028158 | A1 | 1/2008 | Bartley et al. |
| 2008/0225603 | A1 | 9/2008 | Hein |
| 2011/0239031 | A1* | 9/2011 | Ware .................. G11C 7/22 713/500 |
| 2012/0327726 | A1* | 12/2012 | Tsern ................ G06F 3/0634 365/189.11 |
| 2013/0083611 | A1 | 4/2013 | Ware et al. |
| 2014/0019792 | A1* | 1/2014 | Oh .................... G11C 7/1066 713/501 |
| 2015/0095535 | A1 | 4/2015 | Yu et al. |
| 2019/0102109 | A1 | 4/2019 | Kim et al. |

OTHER PUBLICATIONS

PCT International Search Report and Written Opinion dated Oct. 29, 2012 re International Application No. PCT/US2012/028289. 10 pages.

\* cited by examiner

COMMAND-TRIGGERED DATA CLOCK DISTRIBUTION MODE

CROSS-REFERENCE TO RELATED APPLICATIONS

This application is a continuation of U.S. patent application Ser. No. 17/341,048 filed Jun. 7, 2021 (now U.S. Pat. No. 11,587,605), which is a continuation of U.S. patent application Ser. No. 16/865,928 filed May 4, 2020 (now U.S. Pat. No. 11,049,546), which is a continuation of U.S. patent application Ser. No. 16/032,633 filed Jul. 11, 2018 (now U.S. Pat. No. 10,665,289), which is a continuation of U.S. patent application Ser. No. 15/616,209 filed Jun. 7, 2017 (now U.S. Pat. No. 10,026,466), which is a continuation of U.S. patent application Ser. No. 15/242,423 filed Aug. 19, 2016 (now U.S. Pat. No. 9,704,560), which is a continuation of U.S. patent application Ser. No. 14/799,362 filed Jul. 14, 2015 (now U.S. Pat. No. 9,430,027), which is a continuation of U.S. patent application Ser. No. 13/980,368 filed Sep. 6, 2013 (now U.S. Pat. No. 9,098,281), which is a 35 U.S.C. § 371 U.S. National Stage of International Patent Application No. PCT/US2012/028289 filed Mar. 8, 2012, which claims priority to U.S. Provisional Patent Application No. 61/451,023 filed Mar. 9, 2011. Each of the foregoing patent applications is hereby incorporated by reference.

TECHNICAL FIELD

The present invention relates generally to the field of integrated circuits, and to power management technologies during events like power-down exit for such devices.

BACKGROUND

Modern integrated circuits often include power management modes used for conservation of power. For example, many devices implement a power-down mode in which the integrated circuit conserves power by deactivating input and output buffers, excluding certain buffers for signals needed for exiting the power-down mode. On exiting the power-down mode, the buffers are reactivated and the clock, addresses and decoded commands are distributed to the necessary elements of the device.

Many designs now operate with faster and slower clocks in respective domains on the device. Memory devices for example often include a clock, called a control clock herein, used for command and address logic and other functions on the device, and a data clock used for driving high speed data path circuits and data interfaces on the device. The data clock in such systems may run at a higher frequency than the control clock. Recovery from a power-down mode, and other operations changing power management modes for such devices, can require reactivating circuits in both the control clock domain and circuits in the data clock domain.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

Figure 1:
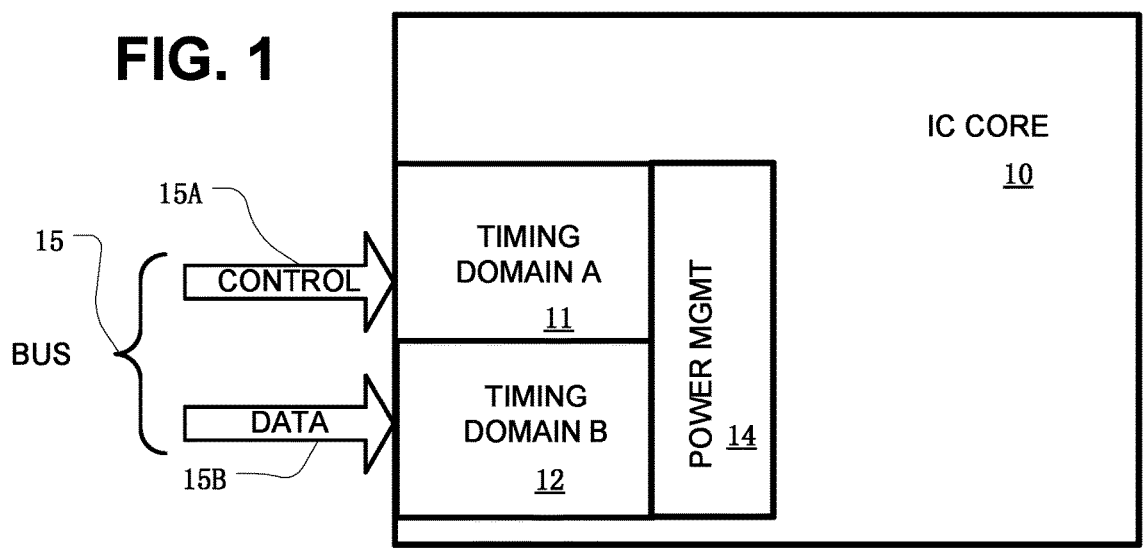
FIG. 1 is a block diagram of an integrated circuit, including power management circuits, as described herein, and a plurality of clock domains in a physical layer interface.

FIG. 1 is a simplified block diagram of an integrated circuit 10 having a plurality of timing domains in its physical layer interface circuitry, and power management circuits which control enablement of timing signals in the clock domains. So for a simplified example, an integrated circuit 10 includes a data channel interface for a bus 15, having at least one control line 15A (e.g. bus address and control lines) operating with a first timing regime, and having at least one data line 15B (e.g. bus data lines) operating with a second timing regime. The integrated circuit 10 has a first group 11 of one or more circuits in a first timing domain (Timing Domain A) to process a command and address signal, and which interfaces signals in the first timing regime on the bus line(s) 15A with a memory core, and a second group 12 of one or more circuits operating in second timing domain (Timing Domain B) to process a data signal, and which interfaces signals in the second timing regime on the bus line(s) 15B with the memory core. Use of the timing signals in the first and second groups 11, 12, is enabled and disabled by power management logic 14 on the device according to power management modes by applying a first enable signal to the first group 11, and a second enable signal to the second group. At least one mode implemented by the power management logic 14 causes one of the first and second groups to be enabled to use its timing signals to support memory transactions on the bus 15, while the other is not enabled for the same memory transaction, or not enabled for at least a portion of the same memory transaction.

The first and second timing regimes on the bus 15 and first and second groups 11, 12 of circuits on the integrated circuit 10 can operate in response to timing signals comprising first and second clock signals, or other signals that provide timing references for the interface between the bus and IC core circuits. The first and second timing signals can be provided by external sources. Alternatively, one of the timing signals can be provided by an external source, and the other of the timing signals can be derived from the externally-sourced timing signal. In some examples, one of the timing signals can be generated using a clock divider as a function of the other timing signal. In other examples, where a quadrature clock is used as one of the timing signals, one phase of the quadrature clock can be used as the other timing signal. Also, both timing signals can be generated on the integrated circuit 10 using separate on-chip circuits. Other timing signal generation schemes can be used as appropriate for particular applications of the technology.

The architecture illustrated in FIG. 1 can be applied to memory devices, such as synchronous dynamic random access memory SDRAM devices, as well as other classes of integrated circuits operating with buses that include multiple timing regimes. Exemplary integrated circuits including the architecture illustrated in FIG. 1 include so-called system on a chip devices that integrate memory arrays with other non-memory circuitry on a single integrated circuit.

SDRAM devices, along with other types of memory, are being implemented to conserve power consumption during operation. For example, standard SDRAM specifications describe a power-down mode which can be entered and exited while the memory device is in the active state, in response to a clock enable CKE signal. During the power-down mode, interface circuits on the device that are not necessary for detecting events needed to signal exit from the power-down mode are deactivated by disabling distribution of the clock signals to some of the interface circuits, and by disabling some of the receiver amplifiers and transmitter amplifiers in the interface circuits. For example, according to the DDR3 standard specification, during power-down the input and output buffers, excluding CK, CK #, ODT, CKE and RESET #, are deactivated. In order to exit the power-down mode, these input and output buffers need to be activated. The process of activating the interface circuits introduces a latency for a first memory transaction after exiting the power-down mode. Therefore, during a power-down condition, a valid, executable command can be applied only with power-down exit latency.

As clock rates increase, the amount of power consumed by the circuits also increases. In high-speed memory devices, the data clock is often many times faster than the clock used for address and control signals. Thus circuits in the data clock domain consume more power.

Figure 2:
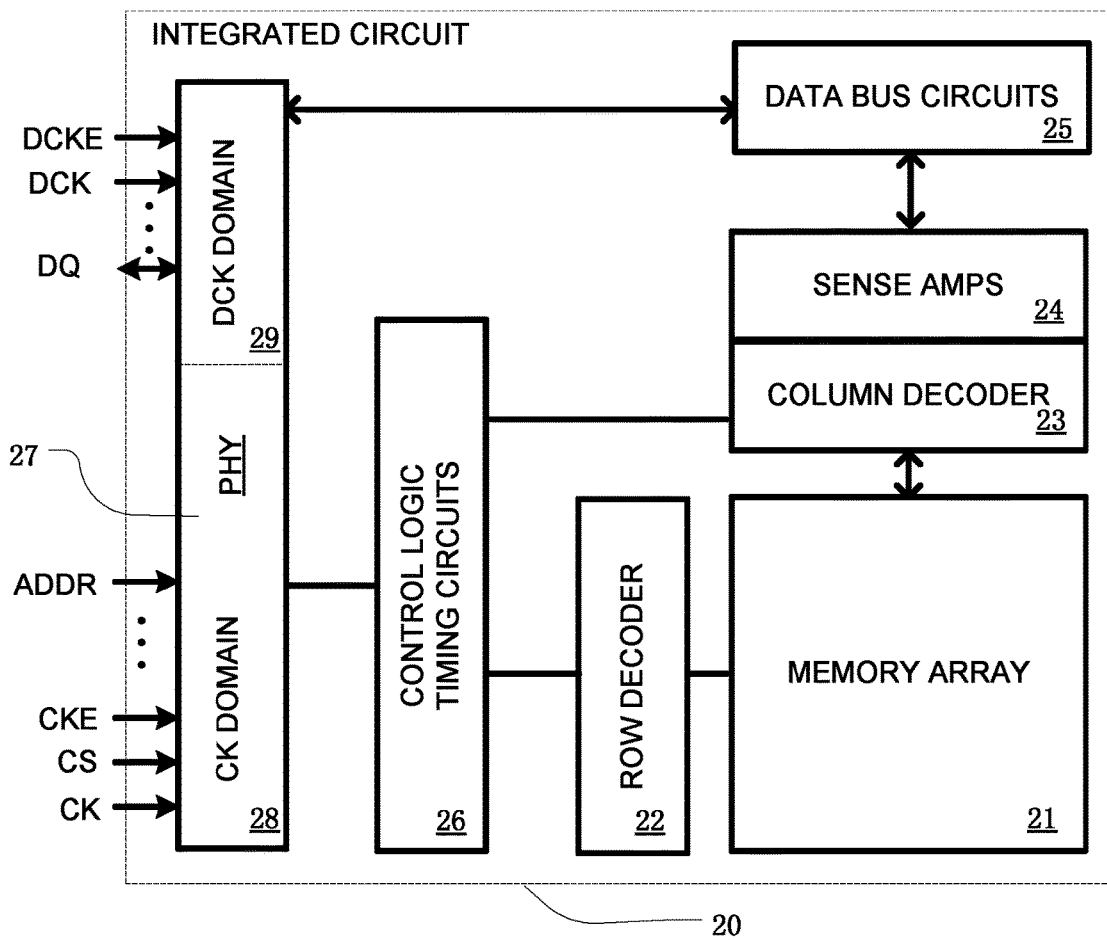
FIG. 2 is a simplified diagram of a memory integrated circuit, including a physical layer interface having a control clock domain and a data clock domain, with different activation logic in each domain.

FIG. 2 is a simplified diagram of a memory integrated circuit or memory device 20. Basic components of the integrated circuit include a memory array 21, which is accessed using a row decoder 22 and a column decoder 23. Sense amplifiers 24 are coupled to the column decoder 23, and through the column decoder 23 to data bus circuits 25, such as buffers, multiplexers, drivers and so on. The device can include control logic and timing circuits 26 (including a command decoder) by which memory operations are executed. The data bus circuits 25 and the control logic and timing circuits 26 are coupled to a plurality of physical layer interface circuits, labeled PHY 27 in the diagram. The PHY 27 provides a physical layer interface for a plurality of data, address and control signals for the memory device 20. In the illustrated example, a first set of signals includes a data clock enable DCKE, a timing signal referred to as data clock DCK, and data DQ. A second set of signals includes a timing signal referred to as control clock CK, a chip select CS, a clock enable CKE, and addresses ADDR. The PHY 27 includes a control clock domain 28 and the data clock domain 29. The interface circuits for the first set of signals (e.g., a data interface) are part of the data clock domain and process data being exchanged with the memory array, and the interface circuits for the second set of signals (e.g., a request interface) are part of the control clock domain and process received commands. The interface circuits in the data clock domain 29 are coupled to the data bus circuits 25, and perform at least one of sampling of, or transmission of, the data signals, and the interface circuits in the control clock domain 28 are coupled to the control logic and timing circuits 26, and sample command and address signals.

The PHY 27 includes an interface control circuit to disable a plurality of interface circuits in the first and second domains in a power-down mode, to enable a first plurality of the interface circuits in the first domain in response to a first event signaling exit from the power-down mode, such as an assertion of the clock enable signal CKE, and to enable a second plurality of interface circuits in the second domain in response to a second event detected after activating the first plurality of interface circuits. As mentioned above, on exit from a power-down mode, a memory operation requiring memory access will involve a memory core latency as the command initiating the operation is decoded, and the signals propagate through the memory core for an interval of time before data is delivered from the memory core to the interface circuits for a read operation, or data is distributed to the memory core from the interface circuits for a write operation. During this memory core latency, it may not be necessary for all of the interface circuits in the data clock domain to be enabled. Thus, the memory device is enabled to generate or detect a second event to manage the activation of the interface circuits in a data clock domain so that they can be enabled with a timing different than the activation of those interface circuits in the control clock domain in order to conserve power. In order that the latency for a memory operation on exit from a power-down mode is as small as possible, the interface circuits in the control clock domain and in the data clock domain are preferably enabled within the memory core latency, for such operations as require access to the memory core. Efficient power conservation can also be achieved by activating only such interface circuits as are needed for execution of a given operation on exit from the power-down mode. Thus, for an operation that does not require memory core access, it may not be necessary to enable the interface circuits in the data clock domain immediately upon exit from the power-down mode. Rather, such interface circuits can be enabled in response to commands requiring memory core access which may occur after one or more other commands are received on exit from the power-down mode.

The second event, in response to which second domain interface circuits are enabled, is represented in FIG. 2 by the external data clock enable signal DCKE. A memory controller or host processor can drive the separate clock enable pins (CKE and DCKE) for the control clock domain and the data clock domain. As discussed in more detail below, the variety of events can act as a signal for activation of the interface circuits in the second domain during exit from a power-down mode. Likewise, although the clock enable signal CKE is commonly used to signal the activation of interface circuits on memory devices during exit from a power-down mode, other events could be utilized for this purpose.

In this example, the data clock DCK is provided by an external source to the memory device 20. In alternative systems, the data clock DCK is produced on the device 20. For example, the data clock DCK can be produced on the device 20, in response to the control clock CK using clock divider circuits and the like.

The technology described herein allows power-down exit to be staggered for the two clock domains. This leads to dissipation of power in the data portion of the PHY 27 only when data transactions are pending. In the DRAM field, for example, non-CAS commands (e.g. refresh, precharge, activate, etc.) can be executed without powering on data clocks in the PHY 27. The technology described here can provide flexibility to meet power-down exit timing with minimal power penalty.

Figure 3:
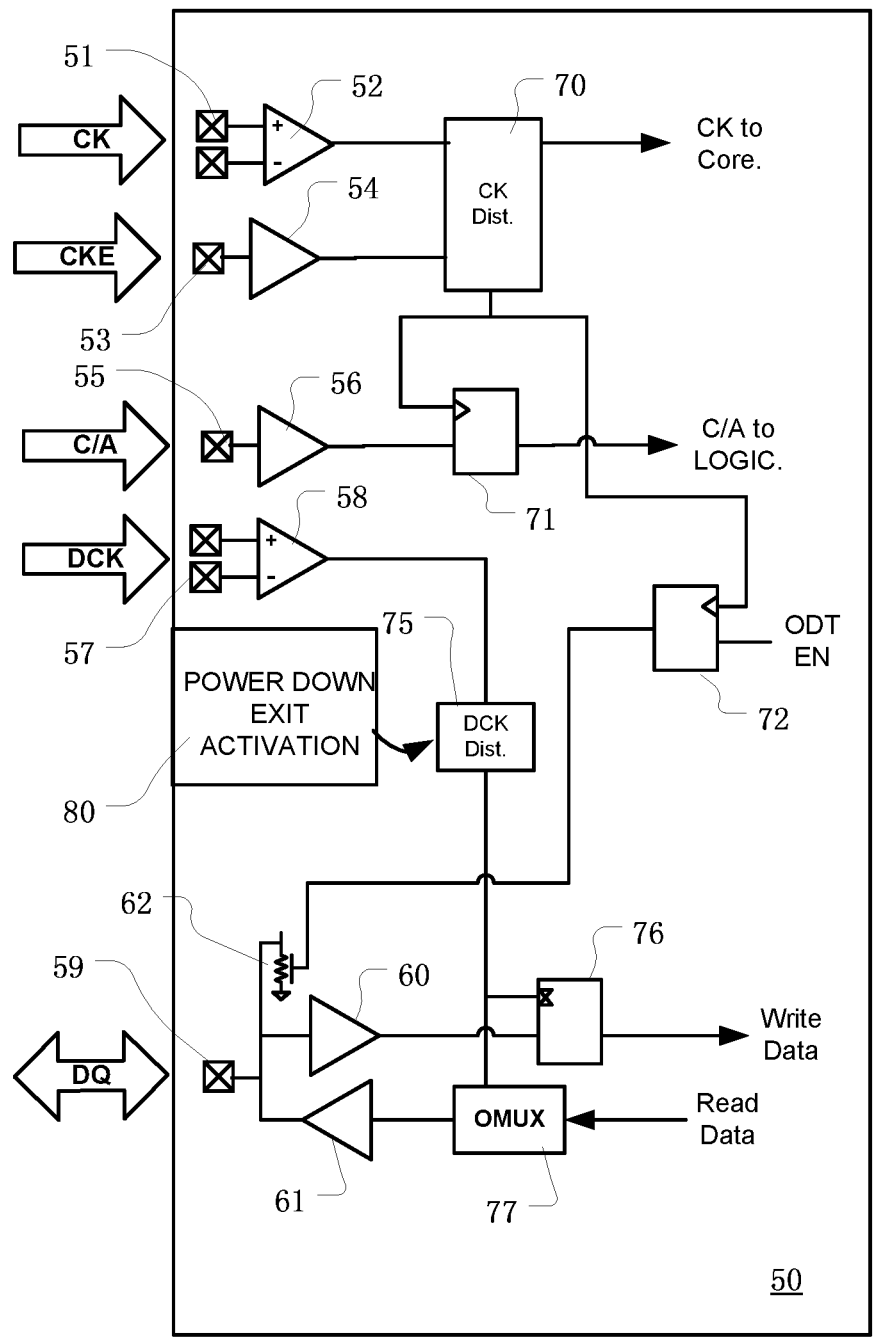
FIG. 3 is a simplified diagram of a physical layer interface for a memory device, such as a high speed synchronous dynamic random access memory, having a control clock CK domain and a higher speed data clock DCK domain, and power-down exit activation circuits enforcing different timing in the two domains.

FIG. 3 is a block diagram of physical layer interface circuits 50 such as could be implemented on a device like that of FIG. 2. In this example, a control clock CK from a source external to the device is coupled to a pair 51 of pads, which in turn are coupled to a clock buffer 52. A clock enable CKE is coupled to pad 53, which is coupled to a buffer 54. A set of command and address C/A signals are coupled to respective pads represented by pad 55, which in turn are coupled to respective buffers, represented by buffer 56. The data clock DCK from a source external to the device is coupled to a pair 57 of pads, which in turn are coupled to clock buffer 58. A set of data signals DQ are coupled to respective pads, represented by pad 59, and to input/output circuitry for the corresponding pad. As illustrated in the FIG. 3, the input/output circuitry for a pad 59 includes an input receiver buffer 60, and an output transmitter buffer 61. Also, on die termination circuitry 62 is coupled to the pads for the data signals, including pad 59.

According to the simplified diagram in FIG. 3, the command and address C/A signals output from buffer 56 are coupled to clocked latches 71. The clocked latches 71 are driven by the control clock CK, via clock distribution circuitry 70. The interface circuits 50 include an on die termination signal ODT EN which is applied by on die termination control circuits to a clocked latch 72. The clocked latch 72 is also driven by the control clock CK via the clock distribution circuitry 70. The clock distribution circuitry 70 is responsive to the clock enable CKE signal supplied by buffer 54, to control activation and deactivation of interface circuits (e.g. 70, 71, 72) within the control clock domain. Of course, events other than assertion of the clock enable CKE signal can be utilized for this purpose.

The data signals DQ output from receiver buffer 60 are coupled to clocked latches 76. The clocked latches 76 are driven by the data clock DCK via data clock distribution circuitry 75. Data signals DQ applied to the transmitter buffer 61 are provided by the output multiplexer 77, which is also clocked by the data clock DCK via the data clock distribution circuitry 75. The data clock distribution circuitry 75 is responsive to a power-down exit activation circuit 80 to control activation and deactivation of interface circuits (e.g. 76, 77, 75) within the data clock domain. The power-down exit activation circuit 80 can implement a variety of logical architectures to control the activation of interface circuits in the data clock domain at a time later than activation of the interface circuits in the control clock domain, such as after a time interval comprising (equal to or longer than, and not necessarily synchronized with) a minimum number of cycles of a selected one of the data clock (i.e. first timing signal) and the control clock (i.e., second timing signal). In this way, the interface circuits operating in response to the high-speed data clock are not enabled prematurely, and power is conserved. The later time can be defined as equal to or longer than at least a minimum number of clock cycles of a clock signal having a common harmonic frequency to both the data clock (i.e., a first timing signal) and the control clock (i.e., a second timing signal), as can be understood with reference to the timing diagrams in FIGS. 4-7.

Figure 4:
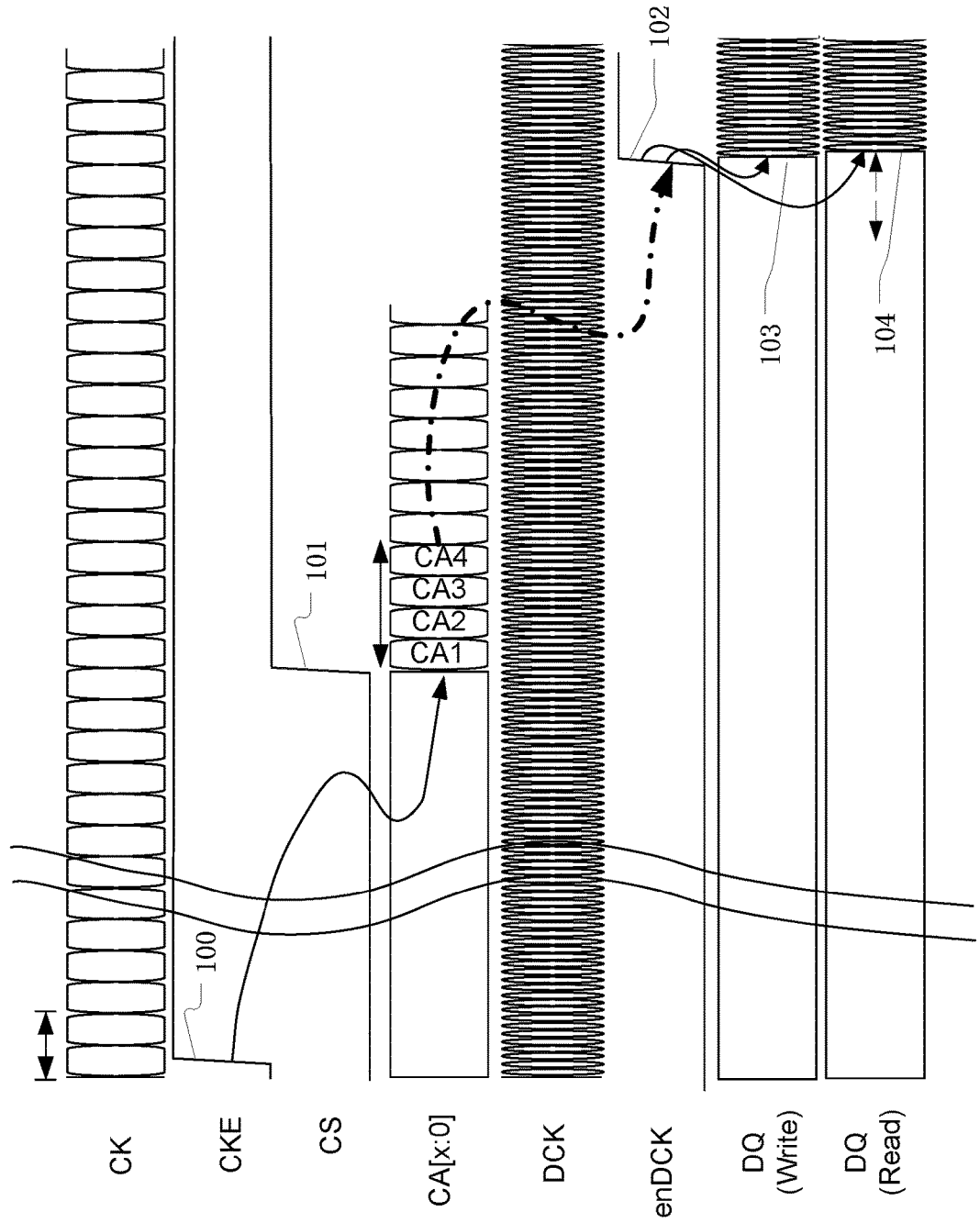
FIG. 4 is a timing diagram illustrating a power-down exit operation according to a first logical architecture.

FIGS. 4-7 are timing diagrams that illustrate logical architectures, or methods, for power-down exit activation which can be used in memory devices like those described above. FIG. 4 includes timing traces for the control clock CK, control clock enable CKE, chip select CS, the command an address signals CA[x:0], the data clock DCLK, an internal data clock enable enDCK, data signals DQ(Write) for a write operation and the data signals DQ(Read) for a read operation. In this example, the clock period for the control clock (two "eyes") can be on the order of 1 to 2 nanoseconds in a modern high-speed memory device. The clock period for the data clock can be about one fourth that of the control clock, so that the data clock is running at four times the speed of the control clock. In a memory device operating with a double data rate DDR data interface, data can be sampled on each edge of the data clock so that a bit period for sampling data would be ⅛ that of the control clock period with a data clock that is four times faster than the control clock. In the example shown in FIG. 4, the clock enable CKE signal transition 100 indicates an operation for exit from power-down. The chip select CS signal transition 101 occurs within a time interval on the order of 7 to 10 nanoseconds for example, allowed for activation of the interface circuits needed for processing the command and address signals applied to the device. The command and address signals become active along with or upon assertion of chip select CS, as indicated by their rough alignment with the transition 101. Typical commands require more than one command/address cycle to indicate a memory operation. After receiving the sequence of commands/address cycles needed to indicate a specific command, and decoding that sequence, power-down exit activation logic can determine whether or not it is necessary to enable the interface circuits in the data clock domain. If the sequence of commands/address cycles predict or indicate a memory core access operation, such as a read or write, then the logic causes the internal data clock enable enDCK to be generated automatically at transition 102. This assertion occurs within a time interval that preferably matches the memory core latency for the memory operation predicted or indicated. As a result, data clock distribution circuits are enabled, and the interface circuits for the data clock domain are enabled as indicated by transitions 103 and 104. Memory core latency for a write operation can be different than the memory core latency for a read operation. Accordingly, an embodiment can cause the interface circuits for the data clock domain to be enabled at times depending on whether a read or write operation is being executed. According to the power-down exit logic architecture of FIG. 4, interface circuits in the data clock domain are enabled only when needed upon exit from a power-down mode. This configuration relies on decoding a sequence of commands/address cycles in order to provide an event indicating that the interface circuits in the data clock domain need to be enabled. This event can only be detected after a first latency, and the interface circuits can only be enabled after a second latency, where the first and second latencies are characteristic of the architecture of the memory device. It is possible that the memory core latency can be less than the sum of the first and second latencies. If this were the case, then this architecture for power-down exit might cause an increase in memory access latency on exit from a power-down mode.

Figure 5:
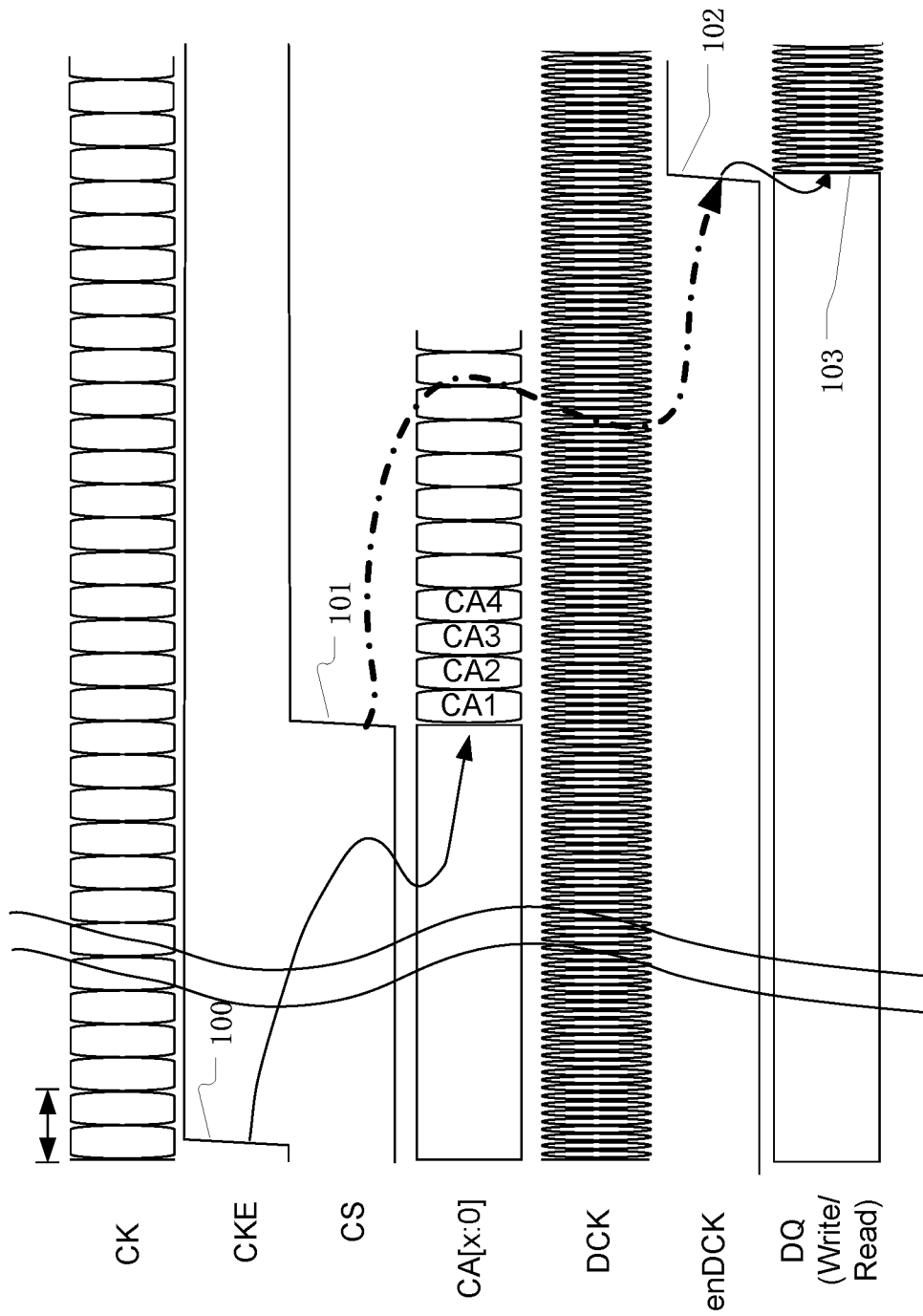
FIG. 5 is a timing diagram illustrating a power-down exit operation according to a second logical architecture.

FIG. 5 illustrates an alternative logical architecture for power-down exit. FIG. 5 includes timing traces for the control clock CK, control clock enable CKE, chip select CS, the command and address signals CA[x:0], the data clock DCLK, an internal data clock enable enDCK, data signals DQ(Write/Read) for a write or read operation. In this example, rather than relying on the decoding of a sequence of command/address cycles, the power-down exit logic for activating the interface circuits in a data clock domain is responsive to the transition 101 on the chip select signal. Since this transition 101 occurs well in advance of the decoding of the sequence of commands/address cycles, the interface circuits in the data clock domain can be enabled earlier. This technique can be used to ensure that memory access latency on exit from power-down mode does not need to be extended to account for activating the interface circuits in the data clock domain. However, the chip select signal does not provide indication about whether the operation requires a memory core access, or whether the operation is a read or write operation for example. Thus, it will cause activation of the interface circuits in the data clock domain for all of memory operations, whether or not these interface circuits are necessary. This can cause power consumption in the interface circuits that is wasted.

Figure 6:
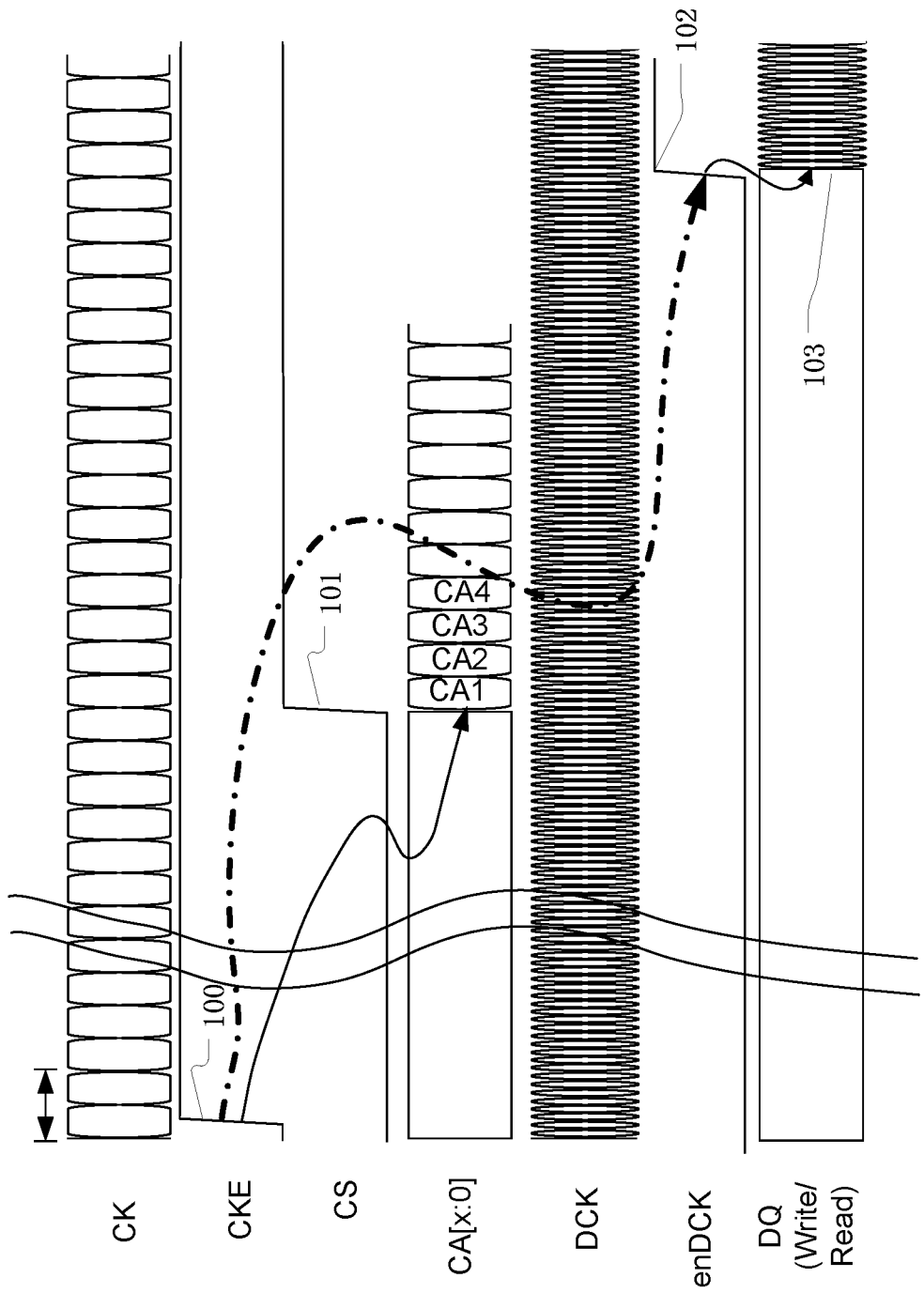
FIG. 6 is a timing diagram illustrating a power-down exit operation according to a third logical architecture.

FIG. 6 illustrates yet another alternative logical architecture for power-down exit. FIG. 6 includes timing traces for the control clock CK, control clock enable CKE, chip select CS, the command and address signals CA[x:0], the data clock DCLK, an internal data clock enable enDCK, data signals DQ(Write/Read) for a write or read operation. In this example, rather than relying on the decoding of a sequence of command/address cycles, or relying on the assertion of the chip select signal, the power-down exit logic for activating the interface circuits in a data clock domain is responsive to the transition 100 on the clock enable CKE signal. Since this transition 100 occurs well in advance of the decoding of the sequence of commands/address cycles, and in advance of the assertion of the chip select signal, the interface circuits in the data clock domain can be enabled earlier. This technique can be used to ensure that memory access latency on exit from power-down mode does not need to be extended to account for activating the interface circuits in the data clock domain. However, the clock enable CKE signal does not provide any indication about whether the operation requires a memory core access, or whether the operation is a read or a write operation for example. Thus, it will cause activation of the interface circuits in the data clock domain for all of memory operations, whether or not these interface circuits are necessary. This can cause power consumption in the interface circuits that is wasted.

Figure 7:
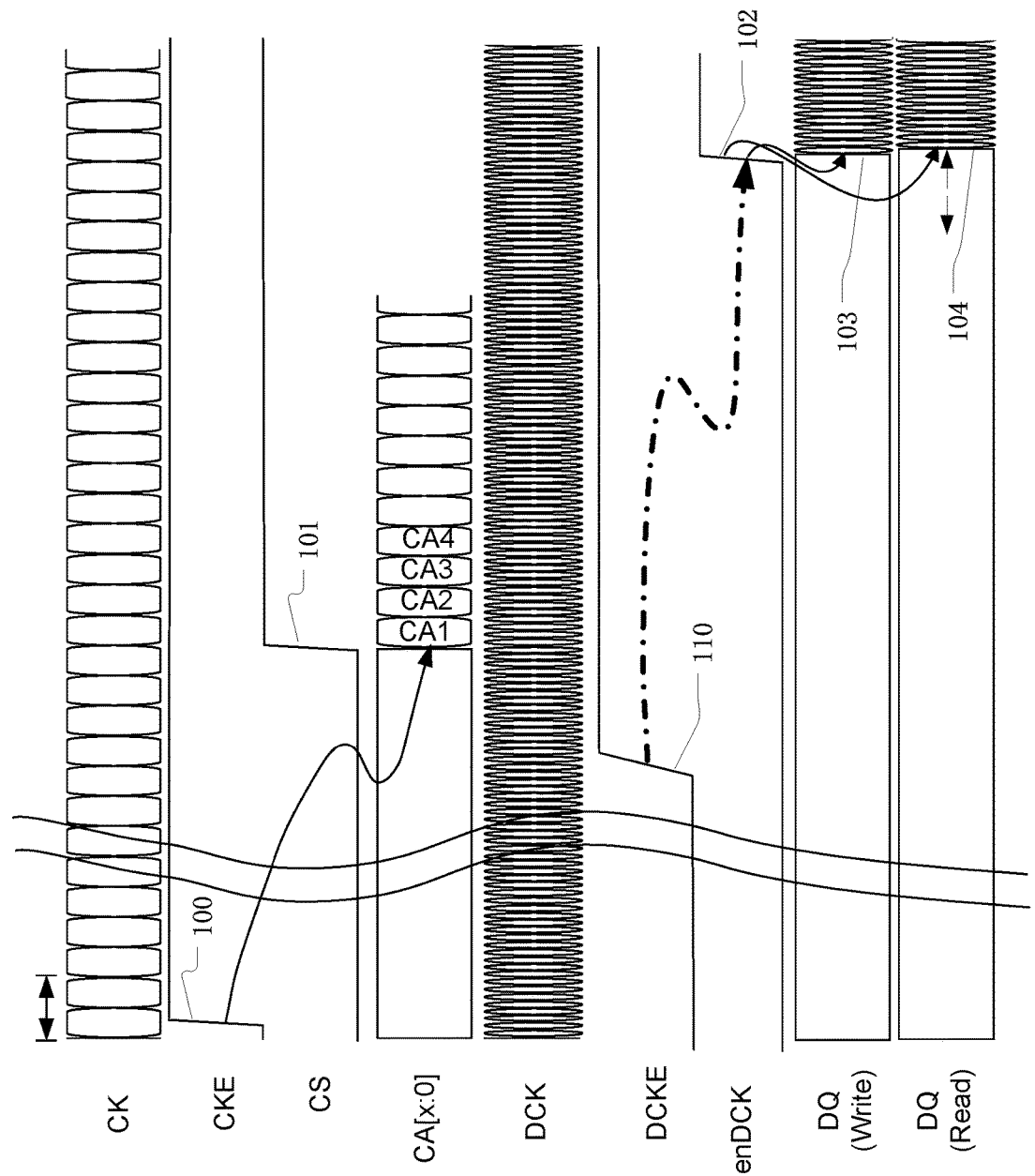
FIG. 7 is a timing diagram illustrating a power-down exit operation according to a fourth logical architecture.

FIG. 7 illustrates yet another alternative, illustrating the use of the external data clock enable DCKE signal. FIG. 7 includes timing traces for the control clock CK, control clock enable CKE, chip select CS, the command and address signals CA [x:0], the data clock DCLK, an internal data clock enable enDCK, data signals DQ(Write) for a write operation and the data signals DQ(Read) for a read operation. Also, FIG. 7 includes a trace for the data clock enable DCKE. In this example, activation logic used for asserting the internal data clock enable enDCK is responsive to the externally supplied data clock enable DCKE. The DCKE signal is provided by an external source, such as a memory controller or host computer. Assertion of the DCKE signal occurs at the transition 110 in FIG. 7, which is in advance of the assertion of the chip select CS signal. This transition 110 is produced by the external source at a time that allows assertion of enDCK at transition 102 to occur at the desired time relative to the memory core latency for the read or write operation that is occurring or predicted to occur. The timing of the assertion of DCKE can be controlled depending on the memory operation to be executed. Also, the logic for implementation of the data clock activation circuits can cause an assertion of the internal enDCK signal at a fixed time after detection of the transition 110 on the DCKE signal. The sources for the DCKE signal can assert the signal only for a memory operation that requires memory core access that is the first in a queue for execution on exit from the power-down mode, and at the proper time for that memory operation. In this manner DCKE can be asserted only during time periods when memory core access is required and can be de-asserted during other times. In other words, if there is a series of transactions where a few of them require DCKE to be asserted while others do not, the timing of DCKE can be adjusted accordingly. During the assertion/de-assertion of DCKE, CKE can continue to be asserted. Therefore, the interface circuits in the data clock domain can be enabled only when needed. Also, the inherent latencies involved in relying on the decoding of a sequence of command/address cycles are no longer a limitation on the timing of the activation of the data domain interface circuits.

A method of operation for a memory device including a first plurality of interface circuits responsive to a first clock and a second plurality of interface circuits responsive to a second clock, can be understood with reference to these timing diagrams, which includes deactivating the first and second pluralities of interface circuits in a power-down mode; activating the first plurality of interface circuits in response to a first event signaling an exit from the power-down mode; and activating the second plurality of interface circuits in response to a second event detected after activating the first plurality of circuits. The interface circuits in the first plurality of interface circuits can be coupled to command and address logic providing address and operation mode control for a memory core, and interface circuits in the second plurality of interface circuits can be coupled to data paths in the memory core. An embodiment of the method for deactivating the first and second pluralities of interface circuits can include disabling distribution of the first and second clocks, while activating the first plurality of interface circuits includes enabling distribution of the first clock in response to a first enable signal and activating the second plurality of interface circuits includes enabling distribution of the second clock, and wherein said event comprises detection of a second enable signal asserted after the first enable signal.

The method can include receiving a first clock enable signal from a source external to the memory at a first control signal interface circuit, and asserting the first enable signal in response to the first clock enable signal; and receiving a second clock enable signal from a source external to the memory at a second control signal interface circuit. In this case, the method includes asserting the second enable signal in response to the second clock enable signal provided by an external source.

The method can include decoding a command after activating the first plurality of interface circuits, and asserting the second enable signal if the decoded command predicts or signals an operation using the second plurality of interface circuits. Alternatively, the method can include receiving a first external clock signal and a second external clock signal at respective clock signal interface circuits from a source or sources external to the memory, and producing the first and second clocks in response to the first external clock signal and the second external clock signal, respectively.

Figure 8:
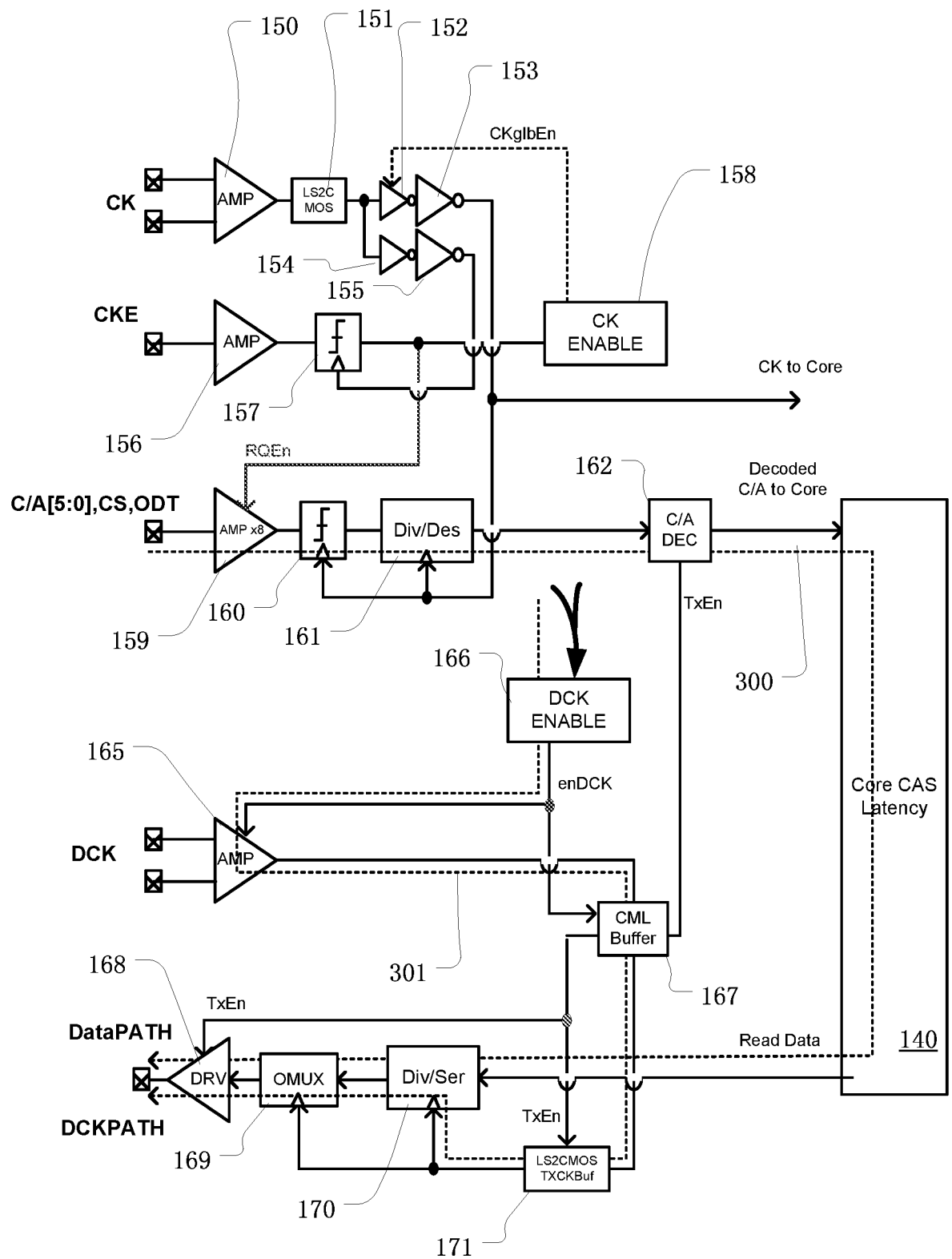
FIG. 8 is a block diagram of a DRAM interface, including separate data clock and control clock enable circuits operable on exit from a power-down mode.

FIG. 8 provides a more detailed logic diagram for a memory device including a physical interface with a control clock domain and a data clock domain, that are enabled with different timing on exit from the power-down mode. The device includes a differential input for an external clock CK that is coupled to amplifier 150, which remains enabled during a power-down mode. Amplifier 150 is connected to a level shifter 151, which translates a low swing signal at the output of the amplifier 150 to a CMOS level clock signal in this example. The output of the level shifter 151 is applied to a first string of clock buffers 152, 153 and to a second string of clock buffers 154, 155. The output of the clock buffer 155 is coupled to a clocked register 157 at the output of amplifier 156. Amplifier 156 is coupled to the input pad for a clock enable signal CKE, and remains enabled during a power-down mode. The output of the clocked register 157 drives a clock enable circuit 158, which outputs a global clock enable signal CKgblEn that is applied to the buffer 152 in the first string of buffers at the output of the level shifter 151. This causes a CK clock to be provided at the output of the buffer 153 only after assertion of the clock enable signal CKE.

The clock at the output of the buffer 153 is applied to the eight sets of interface circuits which receive the command and address signals C/A[5:0], the chip select CS signal and the on die termination ODT signal in this example. Each of the eight sets of interface circuits includes an input amplifier 159, a clocked register 160 clocked by the CK clock from the output of buffer 153, and a divider and deserializer circuit 161 also clocked by the CK clock. In addition, the CK clock at the output of buffer 153 is applied as a control clock to the memory core, to command/address decoding circuits and other logic on the device. The amplifiers 159 in this set of interface circuits are disabled during a power-down mode, and enabled by the signal RQEn, produced in response to the CKE signal at the output of the clocked register 157.

FIG. 8 also illustrates a read data path including output driver 168 coupled to a DQ pad on the chip. The driver 168 receives data signals from the output multiplexer 169, which in turn is supplied by the divider and serializer circuit 170. The divider and serializer circuit 170 coupled to the memory core 140 receive read data. A write data path is not shown in the drawing, but can have a similar, complementary structure.

The device in FIG. 8 also includes a differential input for an external data clock DCK that is coupled to amplifier 165. The output of the amplifier 165 is applied to clock distribution circuits which in this example include a current mode logic buffer 167. The output of the current mode logic buffer 167 is applied to a level shifter 171 (low swing to CMOS in this example) to produce a DCK clock that is applied to the divider/deserializer circuit 170 and to the output multiplexer 169. A transmit enable signal TxEn is used to enable the driver 168 and the level shifter 171. The transmit enable signal TxEn is produced by command/address decoder 162.

An internal data clock enable enDCK signal is used to enable the amplifier 165, and the current mode logic buffer 167 on exit from a power-down mode. The enDCK signal is generated by the data clock enable logic 166 that executes a logic architecture, such as those described above with reference to FIGS. 4 through 7, and can be responsive to one or more signals or events that are detectable on the device.

FIG. 8 illustrates a path 300 which heuristically demonstrates a memory access latency on exit from power-down, and a path 301 which heuristically demonstrates the data clock activation latency. The memory access latency path 300 includes components that are derived from the propagation of command/address signals through amplifier 159 and other interface circuits through the command/address decoder 162 to the memory core 140, and then out of the memory core through the transmit path interface circuits (168, 169, 170) for the data. The data clock activation latency path 301 includes components that are derived from propagation of the signals corresponding to the events that drive the logic 166, through the amplifier 165, the current mode logic buffer 167, level shifter 171 and the interface circuits (160, 169, 170) for the data. As mentioned above, it is desirable that the data clock activation latency be aligned with the memory access latency, so that the interface circuits in the data clock domain are not enabled too early and waste power, and are not enabled unnecessarily in anticipation of memory operations that do not involve the data path.

Figure 9:
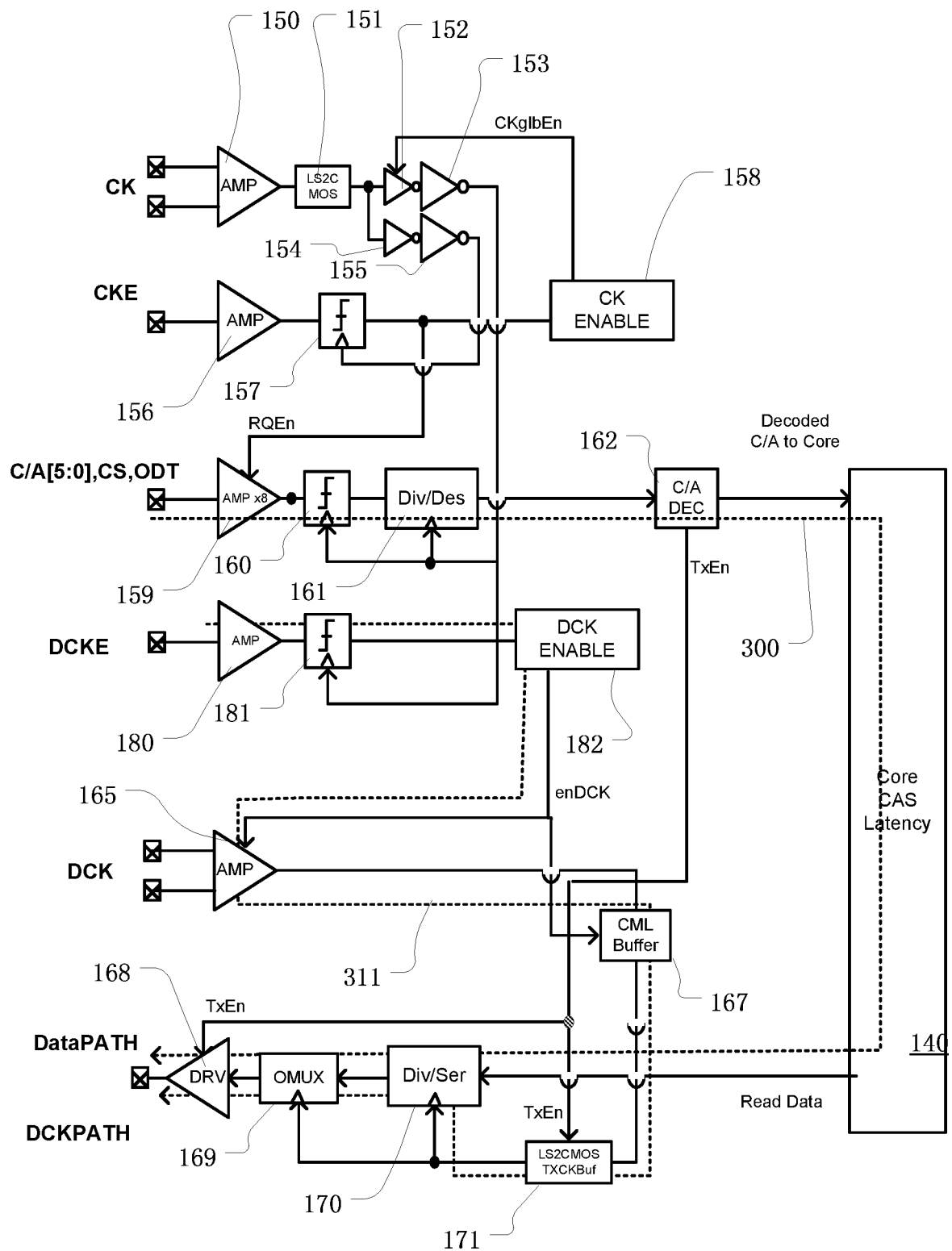
FIG. 9 is a block diagram of a DRAM interface, including a data clock enable circuit including an external data clock enable signal, operable on exit from a power-down mode.

FIG. 9 illustrates an alternative implementation; where the components matching those of FIG. 8 are given the same reference numbers and not described again. In this example, the device includes a DCKE input pad which is coupled to amplifier 180. The output of the amplifier 180 is applied to a clocked register 181, which is clocked by the CK clock from the output of buffer 153 like the command/address path interface circuits. Although not illustrated in this example, the amplifier 180 can remain active during the power-down mode, or, in an alternative embodiment, the RQEn signal or other enable signal can be used to disable the amplifier 180 during power-down, and to enable it on exit from the power-down mode. The output of the clocked register 181 is applied to the data clock enable logic 182. The data clock enable logic 182 produces the internal data clock enable enDCK with the desired timing as described above with reference to FIG. 7.

FIG. 9 illustrates a path 311 which heuristically demonstrates the data clock activation latency. The data clock activation latency path 311 includes components that are derived from propagation of the DCKE signal via amplifier 180, clocked register 181, the data clock enable logic 182, and through the amplifier 165, the current mode logic buffer 167, level shifter 171 and the interface circuits (160, 169, 170) for the data. As described above, because the timing of the DCKE signal can be controlled externally, this embodiment allows for efficient control of the timing of the activation of the interface circuits in the data clock domain.

Figure 10:
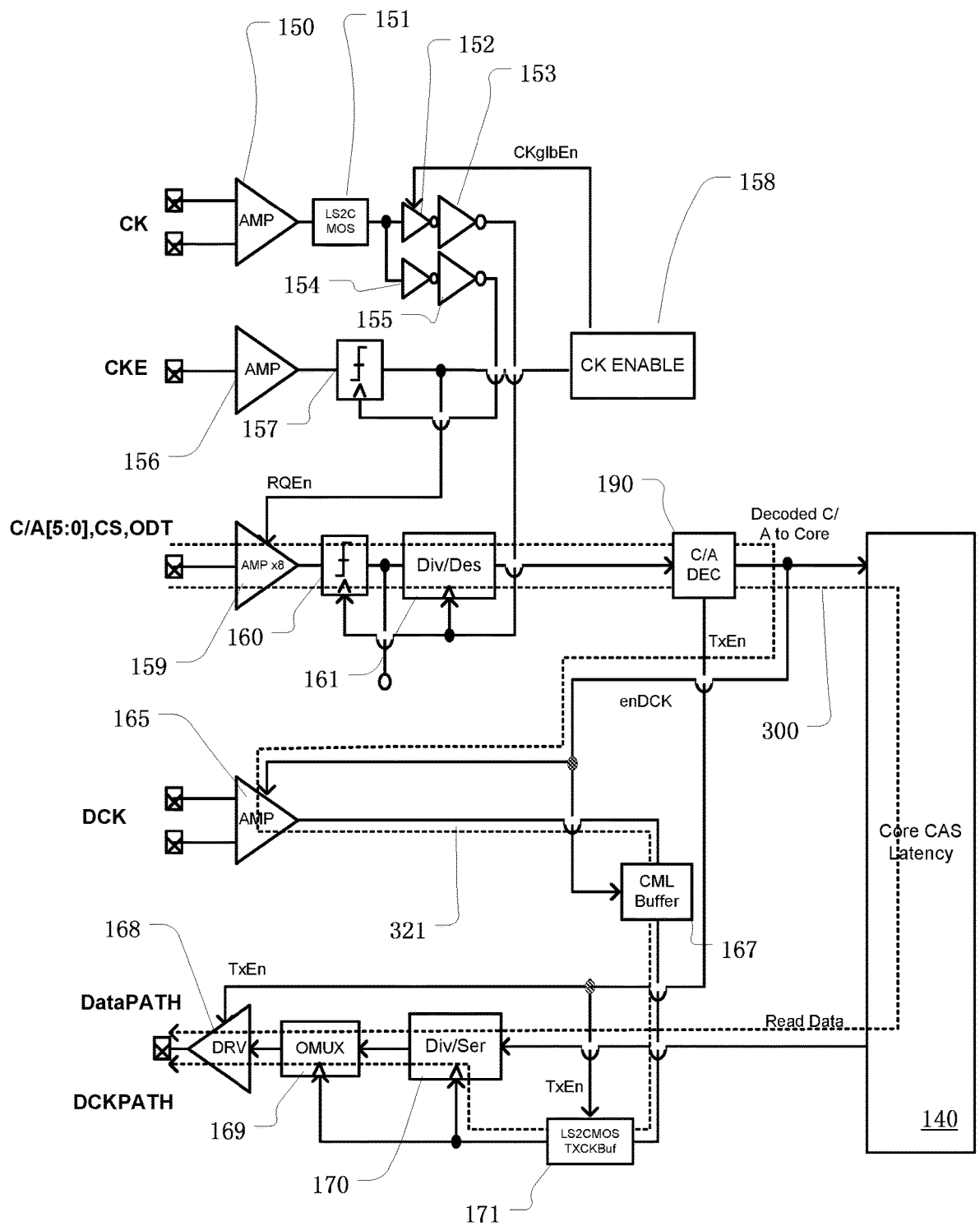
FIG. 10 is a block diagram of a DRAM interface, including a data clock enable circuit responsive to a command decoder, operable on exit from a power-down mode.

FIG. 10 illustrates an alternative implementation, where the components matching those of FIG. 8 are given the same reference numbers and not described again. In this example, a command/address decoder 190 is implemented to detect memory operations requiring memory core access on exit from power-down, and to produce the enDCK as needed, as described above with reference to FIG. 4. FIG. 10 illustrates a path 321 which heuristically demonstrates the data clock activation latency. The data clock activation latency path 321 includes components derived from the propagation of command/address signals through amplifier 159 and other interface circuits through the command/address decoder 190, and through the amplifier 165, the current mode logic buffer 167, level shifter 171 and the interface circuits (160, 169, 170) for the data.

In one approach to implementation, the command/address decoder 190 as shown in FIG. 10 can be adapted to detect a "short command," which can be inserted in a command sequence and detected as an event used for signaling activation of the data domain interface circuits on exit from power-down. A representative memory device may include a command packet that requires a four cycle sequence of commands/address opcodes and address bits to indicate a particular memory operation. This four cycle sequence introduces latency into the data domain activation logic as discussed above. The "short command" can be used which may comprise one or two cycles, which can be decoded with less latency than a full read or write command packet. This would require inserting a look-ahead packet, which could comprise a single cycle opcode, into the command stream during an exit from power-down.

Figure 11:
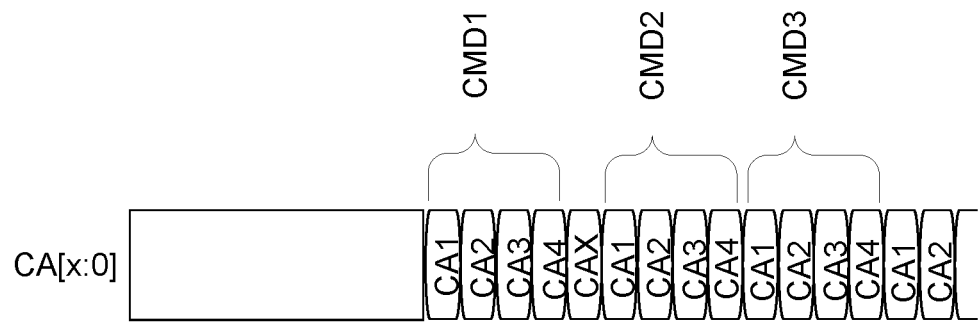
FIG. 11 illustrates a command/address sequence including a "short command" which can be used as an event to signal activation of data domain interface circuits.

FIG. 11 illustrates a command sequence executed on exit from power-down, which includes a first command CMD1 including a four cycle packet (or a sequence of N command/address cycles), which could be an activate command or other command not requiring memory core access. The first command CMD1 is followed by a short command CAX that comprises one cycle (or fewer than N cycles) which acts as a look-ahead indicating a memory core operation is upcoming and to be specified by a later command, such as the second command CMD2, third command CMD3, or another later command. In one example, the third command CMD3 initiates a read or a write operation or another operation that requires activation of the data clock. The second command CMD2 may be directed to a different memory device, or be a command that does not require activation of the data clock. A command/address decoder 190 like that of FIG. 10, detects the short command CAX in advance of the third command CMD3 in this example, enabling the activation of the data domain interface circuits earlier during the memory operation specified by the third command CMD3, decoupling the activation latency for the data domain interface circuits from the decoding of the command specifying their use.

Figure 12:
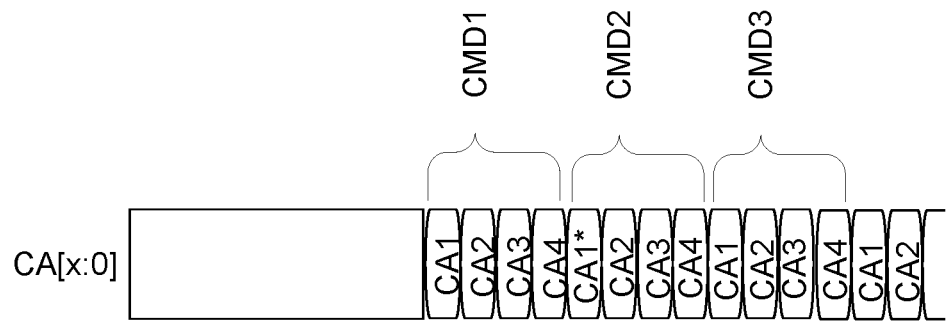
FIG. 12 illustrates a alternative command/address sequence including a modified or dedicated command packet which can be used as both an event to signal activation of data domain interface circuits and a command for an operation requiring such activation.

FIG. 12 illustrates an alternative command sequence executed on exit from power-down, which includes a first command CMD1 including a four cycle packet (or a sequence of N command/address cycles), which could be an activate command or other command not requiring memory core access. The first command CMD1 is followed by a second command CMD2 that comprises an alternate form implemented for example by setting a flag in one of the cycles of the command, such as first cycle CA1*, indicating that a memory core operation is upcoming and to be specified by the third command CMD3, or by another later command. In one example, the third command CMD3 initiates a read or a write operation or another operation that requires activation of the data clock. The second command CMD2, including the alternate form, may initiate a different operation that does not require data clock activation. A command/address decoder 190 like that of FIG. 10, detects the alternative command in advance of the third command CMD3 in this example, enabling the activation of the data domain interface circuits earlier during the memory operation specified by the third command CMD3, decoupling the activation latency for the data domain interface circuits from the decoding of the command specifying their use.

In some systems, the second command CMD2 in the sequence shown in FIG. 12 can be the operation that requires data clock domain activation where the decoding latency is short enough for the particular embodiment. The alternate form of the command sequence can be used to initiate the activation of the data clock domain, along with a read, write or other operation.

Figure 13:
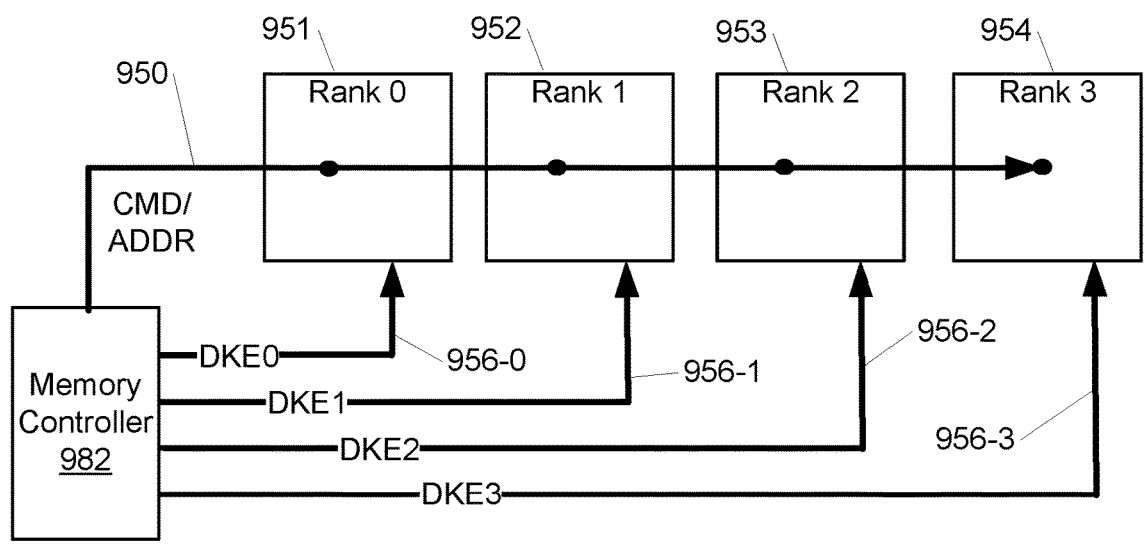
FIG. 13 is a block diagram of a multi-rank memory system including logical or physical data clock enable signals for data clock domain management.

FIG. 13 illustrates an example memory system including four ranks of memory devices, rank 0-rank 3, with a memory controller 982 and a shared signaling bus, including a command/address line 950 connected between the memory controller 982 and one or more memory devices 951-954 in the multiple ranks on the module. In the configuration shown in FIG. 13, each of the memory devices 951-954 within each rank, rank 0-rank 3, receives a separate data clock enable signal DKE0 to DKE3 on respective lines 956-0 to 956-3. The lines 956-0 to 956-3 can be implemented as separate physical signaling lines as shown for example in the embodiment of FIG. 9, or as logical channels communicated via shared physical signaling lines, as discussed with reference to FIGS. 10-12. The memory controller 982 includes logic for asserting the individual DKE0 to DKE3 signals to the memory devices 951-954, with proper timing, interleaved among the command sequences for the target devices. Of course, the technology is extendable to any number of ranks, and to other memory system configurations.

With reference to the multi-rank embodiment, it can be understood that the power conservation modes utilized for integrated circuits with multiple clock domains can include modes based on management for the clock enable signals that do not cause power down of the devices. For example, in the multi-rank embodiment having N ranks, the command/address bus can be shared among the ranks of devices. In this case, any one device controls the bus for only 1/N of the total cycles. So, a power conservation mode can be utilized that enables and disables the data clock domain as needed for the individual ranks while the control clock domain remains enabled for other operations, such as for example arbitration of access to the bus.

In examples described above, the command/address channels are packetized. In other embodiments, commands and addresses can delivered over separate channels. Also, discrete signals lines can be used for some or all of the commands. For example, a command, address, and control path with discrete signals, each with a specific function (similar to that of the DDR3 standard specification) could also be employed.

A memory device described herein includes a physical layer interface having a first clock domain and a second clock domain, circuits that enable the first clock domain during exit from a power-down mode, and circuits that enable the second clock domain after the first clock domain is enabled during exit from the power-down mode. The first clock domain can include interface circuits coupled to a command and address path in the memory, and the second clock domain can include interface circuits coupled to a data path in the memory. The memory device is characterized by a memory core latency for a read or write on exit from a power-down mode, and in embodiments described herein, the event causing activation of the data clock domain interface circuits occurs at a time such that the activating of the data clock domain interface circuits is completed within the memory core latency. The memory can include a first input interface for a first clock enable signal (e.g. CKE) and a second input interface for a second clock enable signal (e.g. DCKE) from an external source or sources. The circuits that enable the first clock domain are responsive to the first clock enable signal, and the circuits that enable the second clock domain are responsive to the second clock enable signal. Alternatively, the memory device can include a command decoder coupled to the first clock domain; and a first input interface for a first clock enable signal (e.g. CKE) from an external source or sources, wherein the circuits that enable the first clock domain are responsive to the first clock enable signal, and the circuits that enable the second clock domain are responsive to the command decoder.

It should be noted that the various circuits disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, computer storage media in various forms (e.g., optical, magnetic or semiconductor storage media, whether independently distributed in that manner, or stored "in situ" in an operating system).

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the present invention. In some instances, the terminology and symbols may imply specific details that are not required to practice the invention. For example, any of the specific numbers of bits, signal path widths, signaling or operating frequencies, component circuits or devices and the like may be different from those described above in alternative embodiments. In other instances, well-known circuits and devices are shown in block diagram form to avoid obscuring the present invention unnecessarily. Additionally, links or other interconnection between integrated circuits or internal circuit elements or blocks may be shown as buses or as single signal lines. Each of the buses may alternatively be a single signal line, and each of the single signal lines may alternatively be buses. Signals and signaling links, however shown or described, may be single-ended or differential. A signal driving circuit is said to "output" a signal to a signal receiving circuit when the signal driving circuit asserts (or deasserts, if explicitly stated or indicated by context) the signal on a signal line coupled between the signal driving and signal receiving circuits. The term "control clock" is used herein simply for the purpose of distinguishing the clock from the "data clock." No specific control function is implied by the name "control clock." The term "coupled" is used herein to express a direct connection as well as a connection through one or more intervening circuits or structures. Integrated circuit "programming" may include, for example and without limitation, loading a control value into a register or other storage circuit within the device in response to a host instruction and thus controlling an operational aspect of the device, establishing a device configuration or controlling an operational aspect of the device through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The terms "exemplary" and "embodiment" are used to express an example, not a preference or requirement.

While the invention has been described with reference to specific embodiments thereof, it will be evident that various modifications and changes may be made thereto without departing from the broader spirit and scope. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

What is claimed is:

1. A method of controlling an integrated-circuit memory component ("memory IC"), the method comprising:
   outputting a command/address clock signal and a data clock signal to the memory IC, the data clock signal having a frequency at least twice the frequency of the command/address clock signal; and
   programming a first control value within a register within the memory IC to implement a configuration of the memory IC in which, after disabling distribution of the data clock signal within the memory IC to reduce power consumption, distribution of the data clock signal within the memory IC is re-enabled in response to receipt of a memory access command.

2. The method of claim 1 wherein programming the first control value within the register comprises outputting, to a command/address interface of the memory IC, a command to store the first control value within the register.

3. The method of claim 1 wherein programming the first control value within the register comprises implementing, as the configuration of the memory IC, an operating configuration in which distribution of the data clock signal within a synchronous data interface of the memory IC is re-enabled in response to receipt of the memory access command.

4. The method of claim 3 further comprising outputting the memory access command to the memory IC to re-enable distribution of the data clock signal within the synchronous data interface.

5. The method of claim 4 wherein the memory access command is to enable execution, within the synchronous data interface of the memory IC, of either a write data reception operation specified by the memory access command or a read data transmission operation specified by the memory access command.

6. The method of claim 4 wherein the memory access command is to enable conduction of the data clock signal to timing inputs of at least one of data reception circuitry or data transmission circuitry within the synchronous data interface of the memory IC.

7. The method of claim 1 further comprising, after programming the first control value within the register, rendering the memory IC to a power conservation mode in which distribution of the data clock signal within the memory IC is disabled and then, after rendering the memory IC to the power conservation mode, outputting the memory access command to the memory IC to re-enable distribution of the data clock signal within memory IC.

8. The method of claim 7 further comprising outputting to the memory IC, after rendering the memory IC to the power conservation mode and prior to outputting the memory access command, a command that instructs the memory IC to perform a first operation without enabling distribution of the data clock signal within the memory IC.

9. The method of claim 8 wherein the first operation comprises at least one of a memory refresh operation, a row activation operation or a row precharge operation.

10. The method of claim 7 wherein outputting the memory access command comprises outputting the memory access command synchronously with respect to the command/address clock signal during assertion of a clock-enable signal at a clock-enable input of the memory IC.

11. An integrated-circuit memory control component ("memory control IC") comprising:
- a first clock circuit to output a command/address clock signal to an integrated-circuit memory component ("memory IC");
- a second clock circuit to output a data clock signal to the memory IC, the data clock signal having a frequency at least twice the frequency of the command/address clock signal; and
- control circuitry to implement, by programming a first control value within a register of the memory IC, a configuration of the memory IC in which, after disabling distribution of the data clock signal within the memory IC to reduce power consumption, distribution of the data clock signal within the memory IC is re-enabled in response to receipt of a memory access command.

12. The memory control IC of claim 11 wherein the control circuitry to implement the configuration of the memory IC by programming the first control value within the register of the memory IC comprises a command/address interface to output, to the memory IC, a command to store the first control value within the register.

13. The memory control IC of claim 11 wherein the control circuitry to implement the configuration of the memory IC by programming the first control value within the register of the memory IC comprises circuitry to implement, as the configuration of the memory IC, an operating configuration in which distribution of the data clock signal within a synchronous data interface of the memory IC is re-enabled in response to receipt of the memory access command.

14. The memory control IC of claim 13 wherein the control circuitry comprises command/address interface circuitry to output the memory access command to the memory IC to re-enable distribution of the data clock signal within the synchronous data interface.

15. The memory control IC of claim 14 wherein the command/address interface circuitry is to output, as the memory access command, a command to enable execution, within the synchronous data interface of the memory IC, of either a write data reception operation or a read data transmission operation.

16. The memory control IC of claim 14 wherein the command/address interface circuitry is to output, as the memory access command, a command to enable conduction of the data clock signal to timing inputs of at least one of data reception circuitry or data transmission circuitry within the synchronous data interface of the memory IC.

17. The memory control IC of claim 11 wherein, after programming the first control value within the register, the control circuitry renders the memory IC to a power conservation mode in which distribution of the data clock signal within the memory IC is disabled and then, after rendering the memory IC to the power conservation mode, outputs the memory access command to the memory IC to re-enable distribution of the data clock signal within memory IC.

18. The memory control IC of claim 17 wherein, after rendering the memory IC to the power conservation mode and prior to outputting the memory access command, the control circuitry outputs a command that instructs the memory IC to perform a first operation without enabling distribution of the data clock signal within the memory IC.

19. The memory control IC of claim 18 wherein the first operation comprises at least one of a memory refresh operation, a row activation operation or a row precharge operation.

20. The memory control IC of claim 17 wherein the control circuitry comprises circuitry to assert a clock-enable signal at a clock-enable input of the memory IC and circuitry to output the memory access command synchronously with respect to the command/address clock signal during assertion of the clock-enable signal at the clock-enable input of the memory IC.

21. An integrated-circuit memory control component ("memory control IC") comprising:
- a first clock output to output a command/address clock signal to an integrated-circuit memory component ("memory IC");
- a second clock output to output a data clock signal to the memory IC, the data clock signal having a frequency at least twice the frequency of the command/address clock signal; and
- control circuitry to implement, by programming a first control value within a register of the memory IC, a configuration of the memory IC in which;
  (i) distribution of the data clock signal within the memory IC is disabled for a power down event; and
  (ii) distribution of the data clock signal within the memory IC is re-enabled in response to receipt of a read command; and
- a receiver circuit to receive data from the memory IC, the data output by the memory IC in response to the read command.

* * * * *